(12) United States Patent
Yoo

(10) Patent No.: US 9,331,683 B2
(45) Date of Patent: May 3, 2016

(54) RAMP SIGNAL GENERATOR WITH NOISE CANCELING FUNCTION

(71) Applicant: SK hynix Inc., Gyeonggi-do (KR)

(72) Inventor: Si-Wook Yoo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/460,839

(22) Filed: Aug. 15, 2014

(65) Prior Publication Data

US 2015/0263714 A1 Sep. 17, 2015

(30) Foreign Application Priority Data

Mar. 17, 2014 (KR) .......................... 10-2014-0030912

(51) Int. Cl.
*H03K 5/1252* (2006.01)
*H03K 4/08* (2006.01)

(52) U.S. Cl.
CPC .............. *H03K 5/1252* (2013.01); *H03K 4/08* (2013.01)

(58) Field of Classification Search
CPC ............. H03K 4/00; H03K 4/12; H03K 4/20; H03K 4/24; H03K 4/50; H03K 4/90; H03K 5/00; H03K 5/1252

USPC .......................................................... 327/133
See application file for complete search history.

(56) References Cited

U.S. PATENT DOCUMENTS

| 2006/0125673 A1* | 6/2006 | Lee ........................ H03K 4/50 341/155 |
| 2012/0038809 A1* | 2/2012 | Lee ....................... H04N 5/3575 348/308 |
| 2014/0055176 A1* | 2/2014 | Zhang ...................... H03K 4/00 327/137 |
| 2014/0070899 A1* | 3/2014 | Liu ....................... H03B 5/1228 331/117 FE |

* cited by examiner

*Primary Examiner* — John Poos
*Assistant Examiner* — David Mattison
(74) *Attorney, Agent, or Firm* — IP & T Group LLP

(57) ABSTRACT

A ramp signal generator includes a reset control block suitable for generating a switch control signal according to a reset control signal from a control unit; a ramp signal generation block suitable for generating differential ramp signals, which include a power noise or a ground noise as well as a ramp noise; and a common noise canceling unit suitable for being initialized according to the switch control signal, and suitable for canceling common noise through a differential operation between the differential ramp signals.

20 Claims, 4 Drawing Sheets

RAMP SIGNAL GENERATOR WITH NOISE CANCELING FUNCTION

CROSS-REFERENCE TO RELATED APPLICATIONS

The present application claims priority of Korean Patent Application No. 10-2014-0030912, filed on Mar. 17, 2014, which is incorporated herein by reference in its entirety.

BACKGROUND

1. Field

Various exemplary embodiments of the present invention relate to a ramp signal generator for generating a ramp signal (ramp voltage) and, more particularly, to a ramp signal generator having a noise canceling function, which cancels noise contained in differential ramp signals provided from a ramp signal generation block using a voltage buffer or a programmable gain amplifier (PGA), and outputs a single-ended ramp signal.

2. Description of the Related Art

In general, a ramp signal generation block using a current steering digital-analog converter (DAC) is applied to a complementary metal oxide semiconductor (CMOS) image sensor (CIS) using a column parallel single-slope analog-digital converter (ADC). The ramp signal generation block generates a ramp signal (ramp voltage) based on a power supply voltage or a ground voltage. Thus, when the single-ended ramp signal is outputted, power noise or ground noise may be contained in the outputted ramp signal. Furthermore, noise from the ramp signal generation block (simply referred to as "ramp noise") is not filtered, but contained in the outputted ramp signal. This noise increases the overall horizontal noise in the CIS.

SUMMARY

Various embodiments are directed to a ramp signal generator having a noise canceling function, which receives differential ramp signals outputted from a ramp signal generation block through a voltage buffer or a programmable gain amplifier (PGA), cancels common noise, and outputs a single-ended ramp signal.

That is, various embodiments are directed to a ramp signal generator having a noise canceling function, which receives differential ramp signals outputted from a ramp signal generation block using a voltage buffer or a PGA, cancels common noise, and outputs a single-ended ramp signal. This is in contrast to a conventional ramp signal generator, which receives only one of the ramp signals outputted from a ramp signal generation block, and simply outputs the single-ended ramp signal for a single-slope analog-digital converter (ADC).

In an embodiment, a ramp signal generator may include: a reset control block suitable for generating a switch control signal according to a reset control signal from a control unit; a ramp signal generation block suitable for generating differential ramp signals, which include power noise or ground noise as well as ramp noise; a gain control block suitable for generating a capacitor control signal according to a gain control signal from the control unit; and a common noise canceling unit suitable for being initialized according to the switch control signal, and suitable for differentially amplifying the differential ramp signals according to the capacitor control signal, controlling voltage gain, and canceling common noise.

In an embodiment, a ramp signal generator may include: a reset control block suitable for generating a switch control signal according to a reset control signal from a control unit; a ramp signal generation block suitable for generating a ramp signal, which includes a power noise or a ground noise; and a noise canceling unit suitable for being initialized according to the switch control signal, and suitable for canceling noise through a differential operation between the ramp signal and the power noise or the ground noise.

DETAILED DESCRIPTION

Figure 1:
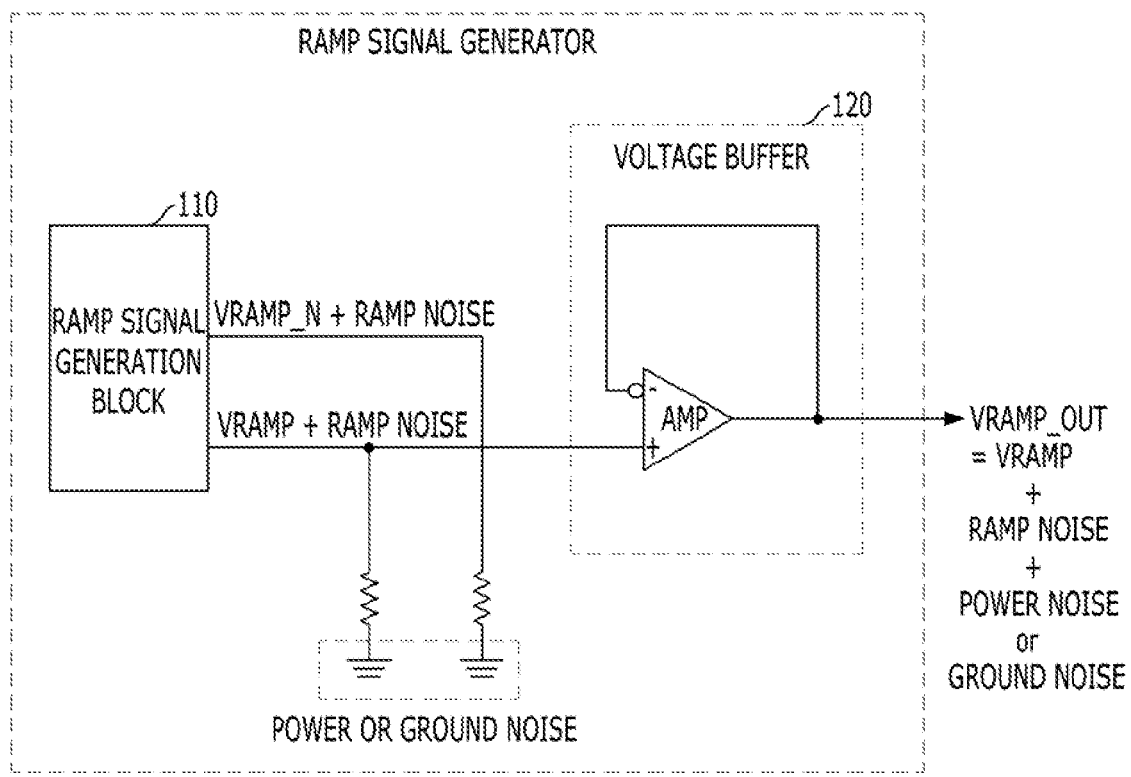
FIG. 1 is a block diagram illustrating a ramp signal generator.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts in the various figures and embodiments of the present invention.

Throughout the specification, when an element is referred to as being "coupled" to another element, the element may be "directly coupled" to the other element and/or "electrically coupled" to the another element with another element interposed therebetween. Furthermore, when it is described that something "comprises" (or "includes" or "has") elements, it should be understood that it may comprise (or include or have) only those elements, or it may comprise (or include or have) other elements as well as those elements. The terms of a singular form may include plural forms, and vice versa, unless otherwise stated.

FIG. 1 is a block diagram illustrating a ramp signal generator, which comprises a voltage buffer and a current steering ADC (a ramp signal generation block), an output terminal of which is coupled to the voltage buffer.

Referring to FIG. 1, the ramp signal generator includes a ramp signal generation block 110 and a voltage buffer 120. The ramp signal generation block 110 generates and outputs ramp signals (ramp voltages), and the voltage buffer 120 receives only one of the ramp signals outputted from the ramp signal generation block 110, and simply output the received single-ended ramp signal. The voltage buffer 120 drives an output load more effectively.

The ramp signals VRAMP_N and VRAMP outputted from the ramp signal generation block 110 contain ramp noise, which is generated from the ramp signal generation block 110, and power noise, or ground noise. Thus, the ramp signal VRAMP_OUT containing such noises is outputted through the voltage buffer 120.

That is, the ramp signal generation block 110 using a current steering DAC generates a ramp signal (ramp voltage)

based on a power supply voltage or a ground voltage. Thus, when a single ended ramp signal is outputted, the power noise or the ground noise is contained in the ramp signal. Furthermore, the ramp noise is not filtered, but contained in the ramp signal. Such noises increases the horizontal noise in a CMOS image sensor (CIS).

In order to solve such a problem, a ramp signal generator in accordance with an exemplary embodiment of the present invention may receive all of differential ramp signals outputted from a ramp signal generation block using a voltage buffer or a programmable gain amplifier (PGA), cancel common noise, and output the singled-ended ramp signal. This is in contrast to the ramp signal generator shown in FIG. 1, which receives only one of the ramp signals outputted from the ramp signal generation block 110 as an input of the voltage buffer 120, and simply outputs the received ramp signal single-endedly.

Figure 2:
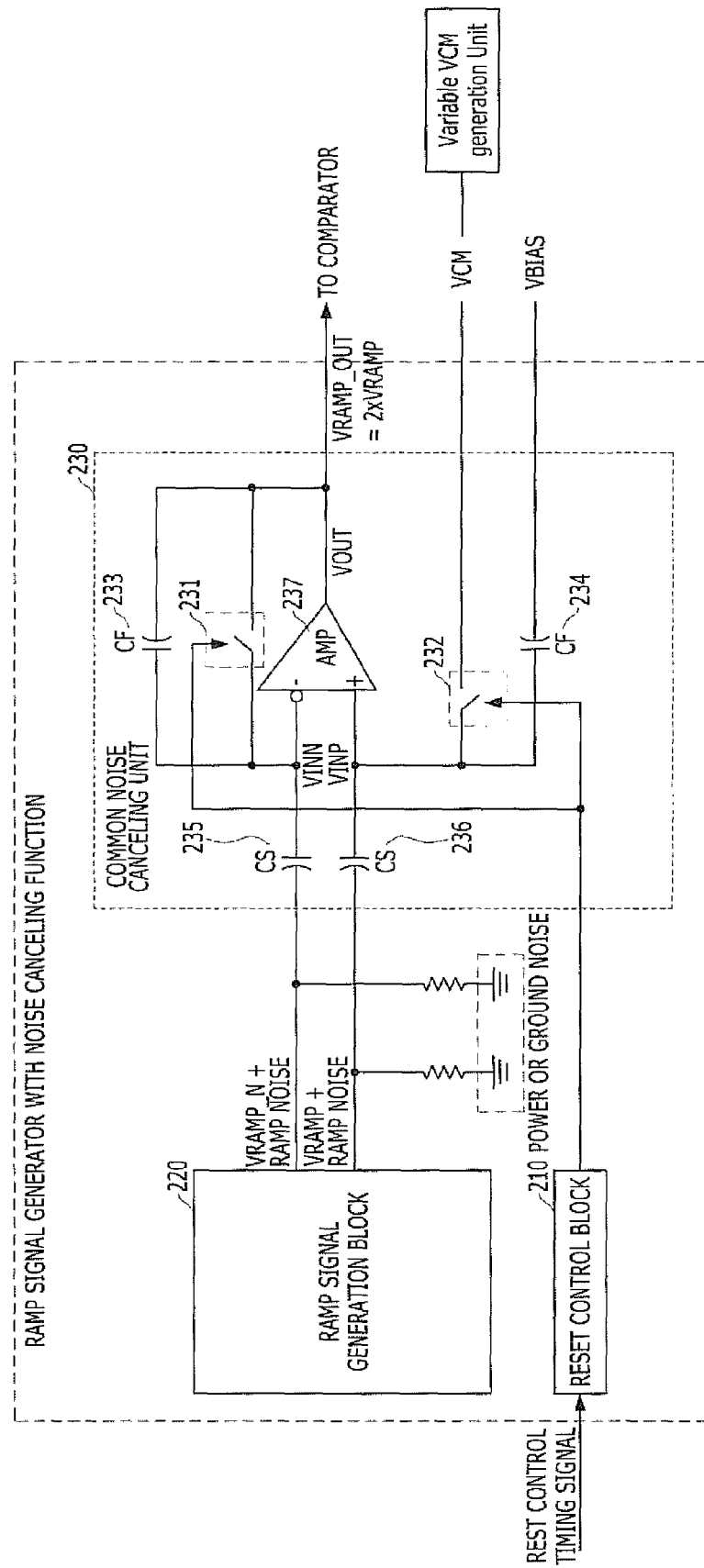
FIG. 2 is a block diagram illustrating a ramp signal generator having a noise canceling function in accordance with an embodiment of the present invention.

FIG. 2 is a block diagram illustrating a ramp signal generator having a noise canceling function in accordance with an embodiment of the present invention.

Referring to FIG. 2, the ramp signal generator having a noise canceling function in accordance with an exemplary embodiment of the present invention may include a reset control block 210, a ramp signal generation block 220, and a common noise canceling unit 230. The reset control block 210 may output a switch control signal to the common noise canceling unit 230 according to a reset control signal from a control unit (not illustrated). The ramp signal generation block 220 may generate and output differential ramp signals VRAMP_N and VRAMP to the common noise canceling unit 230. The common noise canceling unit 230 may be initialized according to the switch control signal from the reset control block 210, cancel common noise through a differential operation between the differential ramp signals VRAMP_N and VRAMP inputted from the ramp signal generation block 220, and output a ramp signal VRAMP_OUT single-endedly.

The respective components will be described in more detail.

The reset control block 210 may generate a switch control signal for controlling a reset switch 231 and an initialization switch 232 included in the common noise canceling unit 230 to be turned on or off according to the reset control signal from the control unit. The reset control signal provided from the control unit may be a reset control timing signal, which is generated once as a pulse before each row of a CIS starts a read-out operation, and transmitted from a control unit within a CIS chip. The reset control block 210 may include a digital core block, for example.

The ramp signal generation block 220 may generate and output the differential ramp signals (differential ramp voltages) VRAMP_N and VRAMP to negative and positive nodes VINN and VINP of a differential amplifier 237 included the common noise canceling unit 230. The ramp signal generation block 220 may be implemented with a well-known current steering DAC. The differential ramp signals VRAMP_N and VRAMP outputted from the ramp signal generation block 220 may contain power noise or ground noise as well as a ramp noise, and may be transferred to the negative and positive nodes VINN and VINP of the differential amplifier 237 included in the common noise canceling unit 230, respectively.

A common mode voltage (VCM) will be described. An external variable VCM generation unit may variably generate and output a common mode voltage VCM according to a VCM level control bit from a control unit to the differential amplifier 237 through the initialization switch 232 of the common noise canceling unit 230. The VCM level control bit may include 0 or 1, and may be transmitted from a control unit within the CIS chip. Then, the variable VCM generation unit may increase or decrease the common mode voltage VCM according to the VCM level control bit including 0 or 1, and apply the generated common mode voltage VCM to the positive node of the differential amplifier 237 through the initialization switch 232. The generated common mode voltage VCM may linearly increase or decrease according to the VCM level control bit including 0 or 1. The control unit may include a digital control block, for example.

Next, a bias voltage VBIAS will be described. A bias voltage VBIAS may be applied from outside to the positive node of the differential amplifier 237 through a second feedback capacitor 234 included in the common noise canceling unit 230. The bias voltage VBIAS may be a DC voltage. For example, the bias voltage VBIAS may be the power supply or ground voltage. The second feedback capacitor 234 may block a DC voltage. The bias voltage VBIAS may be applied to the differential amplifier 237 for AC grounding.

The common noise canceling unit 230 may be initialized according to the switch control signal from the reset control block 210, perform a differential operation between the differential ramp signals VRAMP_N and VRAMP inputted from the ramp signal generation block 220, cancel common noise such as the power noise or ground noise as well as the ramp noise, and output the ramp signal VRAMP_OUT single-endedly. The common noise canceling unit 230 may be a voltage buffer, for example.

The common noise canceling unit 230 may include a switching block including the reset switch 231 and the initialization switch 232, a feedback capacitor block including a first feedback capacitor 233 and the second feedback capacitor 234, and a sampling capacitor block including a first sampling capacitor 235 and a second sampling capacitor 236, and the differential amplifier 237. The switching block may initialize the differential amplifier 237 to the common mode voltage VCM provided from the external variable VCM generation unit according to the switch control signal from the reset control block 210. The feedback capacitor block may have a fixed feedback capacitor value. The sampling capacitor block may sample the differential ramp signals VRAMP_N and VRAMP provided from the ramp signal generation block 220. The differential amplifier 237 may perform a differential operation between the differential ramp signals VRAMP_N and VRAMP sampled through the sampling capacitor 235 and 236, cancel common noise such as power noise or ground noise as well as ramp noise, and output the ramp signal VRAMP_OUT single-endedly.

The reset switch 231 may be provided between the negative node VINN and an output node VOUT of the differential amplifier 237, and the initialization switch 232 may be provided between the positive node VINP of the differential amplifier 237 and the external variable VCM generation unit. When the switch control signal provided from the reset control block 210 is turned on, the reset switch 231 and the initialization switch 232 may be closed. Then, a closed loop feedback path may be formed in the common noise canceling unit 230, and negative node VINN and the output node VOUT of the differential amplifier 237 may have the same level as the level of the common mode voltage VCM inputted to the positive node VINP of the differential amplifier 237 from the external variable VCM generation unit. This means that that the operating (potential) points of the negative node VINN and the output node VOUT of the differential amplifier 237 are reset to the level of the common mode voltage VCM because the differential amplifier 237 needs to have a proper operating point in order to normally operate. The reason that the variable VCM generation unit is used to apply a variable function is to prevent a malfunction of the differential amplifier 237, which may occur when the differential amplifier 237 has no proper operating point because a fixed common mode voltage is used.

The first feedback capacitor 233 may be provided between the negative node VINN and the output node VOUT of the differential amplifier 237, and the second feedback capacitor 234 may be provided between the positive node VINP of the differential amplifier 237 and the node to which the bias voltage VBIAS is inputted, and have a fixed capacitor value (amount).

The first sampling capacitor 235 may be provided between an output node VRAMP_N of the ramp signal generation block 220 and the negative node VINN of the differential amplifier 237, and the second sampling capacitor 236 may be provided between the output node VRAMP of the ramp signal generation block 220 and the positive node VINP of the differential amplifier 237. Each of the first and second sampling capacitors 235 and 236 may have a fixed capacitor value (amount). The first feedback capacitor 233, the second feedback capacitor 234, the first sampling capacitor 235, and the second sampling capacitor 236 may have the same capacitor value as one another.

The differential amplifier 237 may be an inverting differential amplifier that inverts a signal inputted to the negative node VINN thereof. As the reset switch 231 and the initialization switch 232 are turned on, the differential amplifier 237 may be initialized to the level of the common mode voltage VCM inputted to the positive node VINP thereof. Then, when the differential ramp signals VRAMP_N and VRAMP sampled through the first and second sampling capacitors 235 and 236 are inputted to the negative and positive nodes VINN and VINP, the differential amplifier 237 may perform a differential operation between the sampled differential ramp signals VRAMP_N and VRAMP, cancel common noise such as the power noise or ground noise as well as the ramp noise, and output the ramp signal VRAMP_OUT single-endedly (VRAMP_OUT=2*VRAMP).

As described above with reference to FIG. 2, the ramp signal generator may receive the differential ramp signals VRAMP_N and VRAMP outputted from the ramp signal generation block 220, cancel common noise such as the power noise or ground noise as well as the ramp noise through the voltage buffer, and output the ramp signal VRAMP_OUT single-endedly. Thus, the magnitude of the ramp signal VRAMP outputted from the voltage buffer may be increased two times (VRAMP_OUT=2*VRAMP). This means that the output swing of the ramp signal generation block 220 may be reduced two times. Thus, the current consumption of the ramp signal generation block 220 may be reduced two times.

Figure 3:
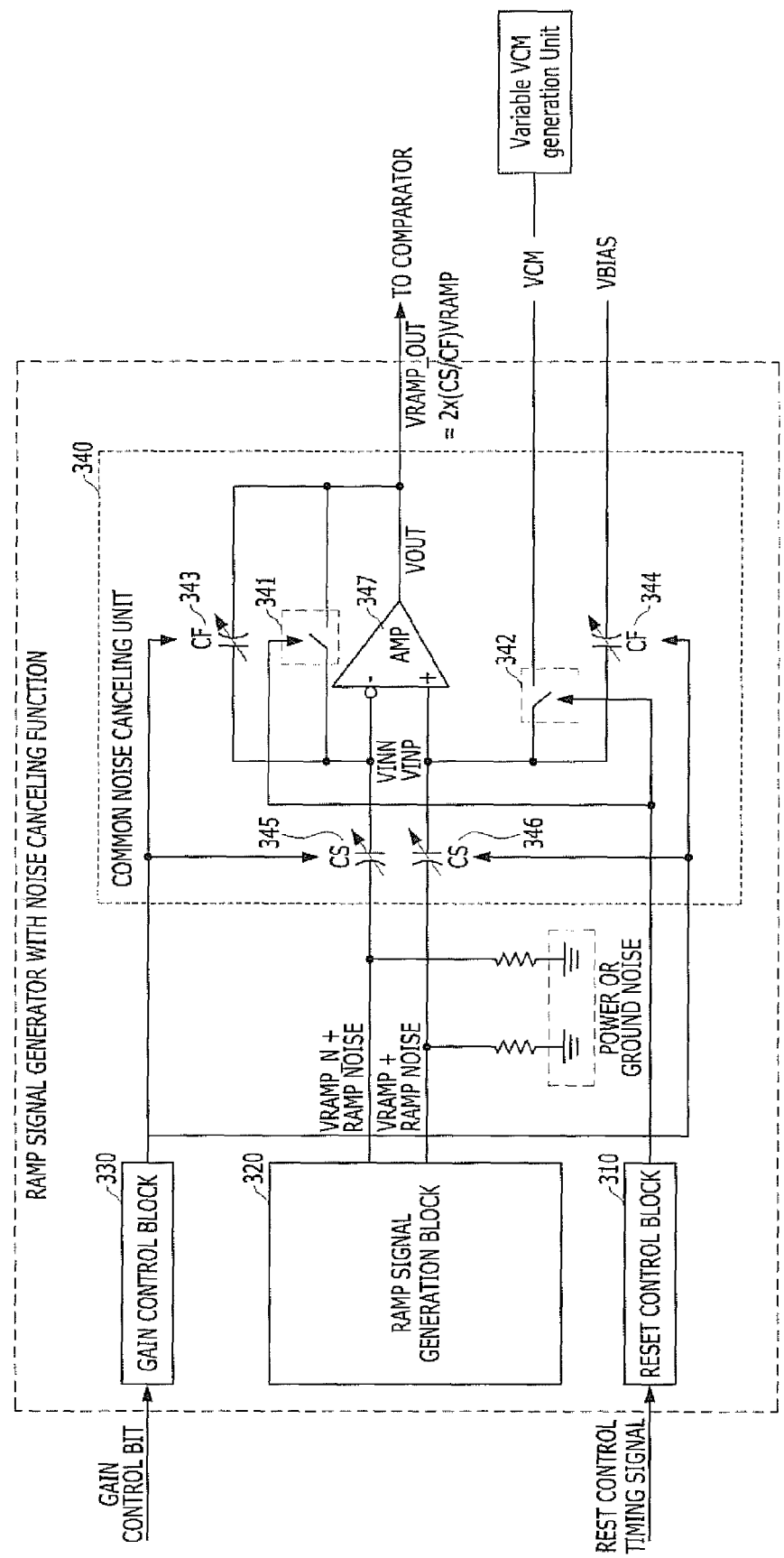
FIG. 3 is a block diagram illustrating a ramp signal generator having a noise canceling function in accordance with another embodiment of the present invention.

FIG. 3 is a block diagram illustrating a ramp signal generator having a noise canceling function in accordance with another embodiment of the present invention.

Referring to FIG. 3, the ramp signal generator having a noise canceling function in accordance with an exemplary embodiment of the present invention may include a reset control block 310, a ramp signal generation block 320, a gain control block 330, and a common noise canceling unit 340. The reset control block 310 may output a switch control signal to the common noise canceling unit 340 according to a reset control signal from a control unit (not illustrated). The ramp signal generation block 320 may generate and output differential ramp signals VRAMP_N and VRAMP to the common noise canceling unit 340. The gain control block 330 may output a capacitor control signal to the common noise canceling unit 340 according to a gain control signal from the control unit. The common noise canceling unit 340 may be initialized according to the switch control signal from the reset control block 310, differentially amplify the differential ramp signals VRAMP_N and VRAMP provided from the ramp signal generation block 320 according to the capacitor control signal from the gain control block 330, control a voltage gain, cancel common noise, and output the ramp signal VRAMP_OUT single-endedly.

The respective components will be described in more detail.

The reset control block 310, the ramp signal generation block 320, a common mode voltage VCM, a bias voltage VBIAS, the reset switch 341, and the initialization switch 342 shown in FIG. 3 may be the same as the reset control block 210, the ramp signal generation block 220, the common mode voltage VCM, the bias voltage VBIAS, the reset switch 231, and the initialization switch 232 described above with reference to FIG. 2.

The gain control block 330 may generate and output the capacitor control signal according to the gain control signal from the control unit to the first and second feedback capacitors 343 and 344, and/or the first and second sampling capacitors 345 and 346 for controlling a feedback capacitor value, and/or a sampling capacitor value of the common noise canceling unit 340. The gain control signal provided from the control unit may be a gain control bit including 0 or 1, and may be received from the control unit within a CIS chip. Then, the gain control block 330 may generate and output the capacitor control signal for increasing or decreasing the feedback capacitor value and/or the sampling capacitor value to the first and second feedback capacitors 343 and 344 and/or the first and second sampling capacitors 345 and 346 according to the gain control bit including 0 or 1. Thus, as expressed by Equation 1 below, a voltage amplification gain Gv may linearly increase or decrease. The gain control block 330 may include a digital core block, for example.

As to gain control for the common noise canceling unit 340, the voltage amplification gain Gv may not be changed during operation of the common noise canceling unit 340, but the digital core block of the CIS may determine the voltage amplification gain Gv according to the brightness of the surrounding environment.

The common noise canceling unit 340 may be initialized according to the switch control signal from the reset control block 310, differentially amplify the differential ramp signals VRAMP_N and VRAMP, which are provided from the ramp signal generation block 320, at the ratio of the capacitor value controlled according to the capacitor control signal from the gain control block 330, control the voltage gain, cancel common noise such as the power noise or ground noise as well as the ramp noise, and output the ramp signal VRAMP_OUT single-endedly. The common noise canceling unit 340 may be a programmable gain amplifier (PGA).

The common noise canceling unit 340 may include a switching block including the reset switch 341 and the initialization switch 342, a feedback capacitor block including a first feedback capacitor 343 and a second feedback capacitor 344, a sampling capacitor block including a first sampling capacitor 345 and a second sampling capacitor 346, and a differential amplifier 347. The switching block may initialize the differential amplifier 347 to a common mode voltage VCM provided from an external variable VCM generation unit according to the switch control signal from the reset control block 310. The feedback capacitor block may have a feedback capacitor value controlled according to the capacitor control signal from the gain control block 330. The sampling capacitor block may sample the differential ramp signals VRAMP_N and VRAMP provided from the ramp signal generation block 320. The differential amplifier 347 may differentially amplify the differential ramp signals VRAMP_N and VRAMP sampled through the sampling capacitor block 345 and 346 according to the ratio of the value of the sampling capacitor block 345 and 346 and the value of the feedback capacitor block 343 and 344 (sampling capacitor value/feedback capacitor value), control a voltage gain, cancel common noise such as the power noise or ground noise as well as the ramp noise, and output the ramp signal VRAMP_OUT single-endedly.

The first feedback capacitor 343 may be provided between negative node VINN and an output node VOUT of the differential amplifier 347, and the second feedback capacitor 344 may be provided between the positive node VINP of the differential amplifier 347 and the node to which the bias voltage VBIAS is inputted. According to the capacitor control signal from the gain control block 330, the values (amounts) of the first and second feedback capacitors 343 and 344 may be controlled to increase or decrease. The first and second feedback capacitors 343 and 344 may be implemented with a combination of a plurality of capacitors and switches (not illustrated), and each of the switches may be opened and closed to determine whether to use the corresponding capacitor.

The first sampling capacitor 345 may be provided between an output node VRAMP_N of the ramp signal generation block 320 and negative node of VINN the differential amplifier 347, and the second sampling capacitor 346 may be provided between the output node VRAMP of the ramp signal generation block 320 and the positive node VINP of the differential amplifier 347. According to the capacitor control signal from the gain control block 330, the values (amounts) of the first and second sampling capacitors 345 and 346 may be controlled to increase or decrease. The first and second sampling capacitors 345 and 346 may be implemented to have a fixed capacitor value.

The differential amplifier 347 may be an inverting differential amplifier that inverts a signal inputted to the negative node VINN thereof. As the reset switch 341 and the initialization switch 342 are turned on, the differential amplifier 347 may be initialized to the level of the common mode voltage VCM inputted to the positive node VINP thereof. Then, when the differential ramp signals VRAMP_N and VRAMP sampled through the first and second sampling capacitors 345 and 346 are inputted to the negative and positive nodes VINN and VINP, the differential amplifier 347 may differentially amplify the differential ramp signals VRAMP_N and VRAMP according to the ratio of the value of the sampling capacitor block 345 and 346 and the value of the feedback capacitor block 343 and 344 (sampling capacitor value/feedback capacitor value), control the voltage gain, cancel common noise such as the power noise, ground noise, and ramp noise, and output the ramp signal VRAMP_OUT single-endedly [VRAMP_OUT=2*(CS/CF)VRAMP].

Thus, the voltage amplification gain Gv may be determined according to the ratio of the sampling capacitor value and the feedback capacitor value, as expressed by Equation 1.

$$Gv=\text{sampling capacitor value/feedback capacitor value} \quad \text{[Equation 1]}$$

As described above with reference to FIG. 3, the ramp signal generator in accordance with an exemplary embodiment of the present invention may receive the differential ramp signals VRAMP_N and VRAMP outputted from the ramp signal generation block 320, differentially amplify the differential ramp signals through the PGA, cancel common noise such as the power noise or ground noise as well as the ramp noise, and then output the ramp signal VRAMP_OUT single-endedly. Thus, the magnitude of the ramp signal VRAMP outputted from the PGA may be increased two times or more [VRAMP_OUT=2*(CS/CF)VRAMP]. This means that the output swing of the ramp signal generation block 320 may be reduced two times or more. Thus, the current consumption of the ramp signal generation block 320 may also be reduced two times or more.

Figure 4:
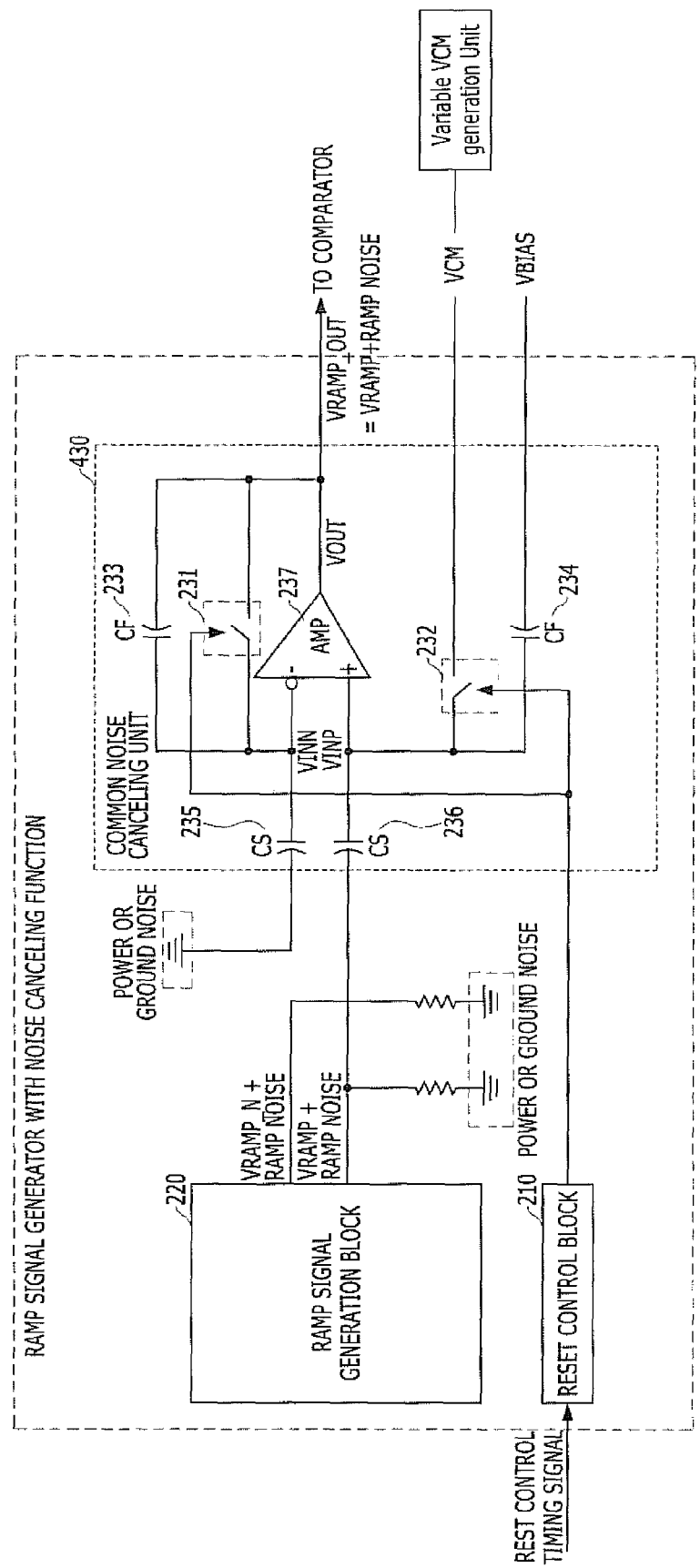
FIG. 4 is a block diagram illustrating a ramp signal generator having a noise canceling function in accordance with another embodiment of the present invention.

FIG. 4 is a block diagram illustrating a ramp signal generator having a noise canceling function in accordance with another embodiment of the present invention.

Referring to FIG. 4, the ramp signal generator having a noise canceling function in accordance with an exemplary embodiment of the present invention may include a reset control block 210, a ramp signal generation block 220, and a noise canceling unit 430. The reset control block 210 may output a switch control signal to the noise canceling unit 430 according to a reset control signal from a control unit (not illustrated). The ramp signal generation block 220 may generate and output a ramp signal VRAMP_N and VRAMP to the noise canceling unit 430. The noise canceling unit 430 may be initialized according to the switch control signal from the reset control block 210, cancel noise through a differential operation between the ramp signal VRAMP inputted from the ramp signal generation block 220 and the power noise or ground noise, and output the ramp signal VRAMP_OUT single-endedly.

The ramp signal generator shown in FIG. 4 may operate in the same manner as the ramp signal generator described above with reference to FIG. 2, except that the power supply or the ground voltage is inputted to the negative node VINN of the differential amplifier 237 instead of one of the ramp signals VRAMP_N and VRAMP outputted from the ramp signal generation block 110.

The ramp signal generation block 220 may generate the differential ramp signals (differential ramp voltages) VRAMP_N and VRAMP, and apply single signal VRAMP to the positive node of the differential amplifier 237 of the noise canceling unit 430. When the single ramp signal VRAMP sampled through the second sampling capacitor 236 is inputted to the positive node VINP of the differential amplifier 237 and the power noise or ground noise sampled through the first sampling capacitor 235 is inputted to the negative node VINN of the differential amplifier 237, the differential amplifier 237 may cancel the power noise or ground noise through a differential operation between the single ramp signal VRAMP, and the power noise or ground noise, and output the ramp signal VRAMP_OUT single-endedly (VRAMP_OUT=VRAMP+ramp noise).

As described above with reference to FIG. 4, the ramp noise may not be canceled, but the power noise or ground noise may be canceled through the voltage buffer.

In accordance with an exemplary embodiment of the present invention, the ramp signal generator may additionally cancel ramp noise as well as the power noise or ground noise generated from the ramp signal generator for a column-parallel single slope ADC, thereby minimizing horizontal noise of the CIS.

Furthermore, the ramp signal generator may receive differential ramp signals outputted from the ramp signal generation block through the single buffer, cancel common noise, and output the ramp signal single-endedly. Thus, the magnitude of the ramp signal outputted from the single buffer may be increased two times. This means that the output swing of the current steering DAC (ramp signal generation block) may be reduced two times. Therefore, the power consumption of the current cell array of the current steering DAC may be reduced two times.

Furthermore, the PGA as well as a simple buffer may be used to implement the ramp signal generator.

Although various embodiments have been described for illustrative purposes, it will be apparent to those skilled in the art that various changes and modifications may be made without departing from the spirit and scope of the invention as defined in the following claims.

What is claimed is:

1. A ramp signal generator comprising:
a reset control block suitable for generating a switch control signal according to a reset control signal from a control unit;
a ramp signal generation block suitable for generating differential ramp signals, which include a power noise or a ground noise as well as a ramp noise; and
a common noise canceling unit suitable for being initialized according to the switch control signal, and suitable for canceling common noise through a differential operation between the differential ramp signals and outputting a ramp signal single-endedly.

2. The ramp signal generator of claim 1,
wherein the common noise cancelling unit comprises a reset switch and an initialization switch, and
wherein the switch control signal controls turn-on and turn-off of the reset switch and the initialization switch.

3. The ramp signal generator of claim 1,
wherein the common noise canceling unit comprises a differential amplifier having first and second input nodes, and
wherein the ramp signal generation block generates and outputs the differential ramp signals to the first and second input nodes.

4. The ramp signal generator of claim 1, wherein the common noise canceling unit cancels the common noise including the power noise or the ground noise as well as the ramp noise.

5. The ramp signal generator of claim 1, wherein the common noise canceling unit is a voltage buffer.

6. The ramp signal generator of claim 1, wherein the common noise canceling unit comprises:
a switching block suitable for initializing a differential amplifier to a level of a common mode voltage provided from a variable common mode voltage generation unit according to the switch control signal;
a feedback capacitor block having a feedback capacitor value;
a sampling capacitor block suitable for sampling the differential ramp signals; and
the differential amplifier suitable for performing a differential operation between the differential ramp signals sampled through the sampling capacitor block, canceling the power noise or the ground noise as well as the ramp noise, and outputting the ramp signal single-endedly.

7. The ramp signal generator of claim 6,
wherein the differential ramp signals are inputted to the first and second input nodes of the differential amplifier, and
wherein the common mode voltage is inputted to the second input node of the differential amplifier.

8. A ramp signal generator comprising:
a reset control block suitable for generating a switch control signal according to a reset control signal from a control unit;
a ramp signal generation block suitable for generating differential ramp signals, which include a power noise or a ground noise as well as a ramp noise;
a gain control block suitable for generating a capacitor control signal according to a gain control signal from the control unit; and
a common noise canceling unit suitable for being initialized according to the switch control signal, and suitable for differentially amplifying the differential ramp signals according to the capacitor control signal, controlling a voltage gain, and canceling common noise and outputting a ramp signal single-endedly.

9. The ramp signal generator of claim 8,
wherein the common noise cancelling unit comprises a reset switch and an initialization switch, and
wherein the switch control signal controls turn-on and turn-off of the reset switch and the initialization switch.

10. The ramp signal generator of claim 8,
wherein the common noise canceling unit comprises a differential amplifier having first and second input nodes, and
wherein the ramp signal generation block generates and outputs the differential ramp signals to the first and second input nodes.

11. The ramp signal generator of claim 8,
wherein the common noise cancelling unit comprises first and second feedback capacitors, and first and second sampling capacitors,
wherein the first and second feedback capacitors have a feedback capacitor value, and the first and second sampling capacitors have a sampling capacitor value, and
wherein the gain control block generates a capacitor control signal for selectively controlling the feedback capacitor value or the sampling capacitor value according to the gain control signal, and selectively outputs the capacitor control signal to the first and second feedback capacitors or the first and second sampling capacitors.

12. The ramp signal generator of claim 8, wherein the common noise canceling unit differentially amplifies the differential ramp signals at a ratio of a capacitor value controlled according to the capacitor control signal, controls a voltage gain, cancels the common noise including the power noise or the ground noise as well as the ramp noise, and outputs the ramp signal single-endedly.

13. The ramp signal generator of claim 8, wherein the common noise canceling unit is a programmable gain amplifier (PGA).

14. The ramp signal generator of claim 8, wherein the common noise canceling unit comprises:
a switching block suitable for initializing a differential amplifier to a level of a common mode voltage provided from a variable common mode voltage generation unit according to the switch control signal;
a feedback capacitor block having a feedback capacitor value controlled according to the capacitor control signal;
a sampling capacitor block suitable for sampling the differential ramp signals; and
the differential amplifier suitable for differentially amplifying the differential ramp signals sampled through the sampling capacitor block according to a ratio of a value of the sampling capacitor block and a value of the feedback capacitor block, controlling a voltage gain, canceling the power noise or the ground noise as well as the ramp noise, and outputting the ramp signal single-endedly.

15. The ramp signal generator of claim 14,
wherein the differential ramp signals are inputted to first and second input nodes of the differential amplifier, and
wherein the common mode voltage is inputted to the second input node of the differential amplifier.

16. A ramp signal generator comprising:
a reset control block suitable for generating a switch control signal according to a reset control signal from a control unit;
a ramp signal generation block suitable for generating a ramp signal, which includes a power noise or a ground noise; and
a common noise canceling unit suitable for being initialized according to the switch control signal, and suitable for canceling noise through a differential operation between the ramp signal and the power noise or the ground noise and outputting a ramp signal single-endedly.

17. The ramp signal generator of claim 16,
wherein the common noise canceling unit comprises a differential amplifier having first and second input nodes, and
wherein the ramp signal generation block generates and outputs the differential ramp signal to the second input node.

18. The ramp signal generator of claim 16, wherein the noise canceling unit is a voltage buffer.

19. The ramp signal generator of claim 16,
wherein the common noise canceling unit comprises a differential amplifier having first and second input nodes,
wherein the ramp signal generation block generates and outputs the differential ramp signal to the second input node, and
wherein a power supply or a ground voltage is coupled to the first input node.

20. The ramp signal generator of claim 1, wherein the ramp signal generation block is a current steering digital-analog converter (DAC).

* * * * *